United States Patent [19]

Iwasaki

[11] Patent Number: 4,983,830
[45] Date of Patent: Jan. 8, 1991

[54] FOCUSED ION BEAM APPARATUS HAVING CHARGED PARTICLE ENERGY FILTER

[75] Inventor: Koji Iwasaki, Tokyo, Japan
[73] Assignee: Seiko Instruments Inc., Tokyo, Japan
[21] Appl. No.: 373,035
[22] Filed: Jun. 29, 1989
[51] Int. Cl.[5] ............................................. G01N 23/22
[52] U.S. Cl. ........................................ 250/309; 250/305; 250/306; 250/310; 324/71.3; 324/158 D
[58] Field of Search ............... 250/309, 310, 305, 306; 324/71.3, 158 D

[56] References Cited

U.S. PATENT DOCUMENTS

| | | | |
|---|---|---|---|
| 3,845,305 | 10/1974 | Liebl | 250/309 |
| 3,930,155 | 12/1975 | Kanomata | 250/309 |
| 4,633,084 | 12/1986 | Gruen et al. | 205/309 |
| 4,683,376 | 7/1987 | Feuerbaum | 250/309 |
| 4,785,172 | 11/1988 | Kubena et al. | 250/309 |
| 4,788,495 | 11/1988 | Plies | 250/310 |
| 4,812,651 | 3/1989 | Feuerbaum et al. | 250/310 |
| 4,829,243 | 5/1989 | Woodard, Sr. et al. | 250/310 |
| 4,831,267 | 5/1989 | Brunner | 250/310 |
| 4,841,143 | 6/1989 | Tamura et al. | 250/309 |
| 4,849,629 | 7/1989 | Daimon et al. | 250/309 |

Primary Examiner—Jack I. Berman
Assistant Examiner—Kiet T. Nguyen
Attorney, Agent, or Firm—Spensley Horn Jubas & Lubitz

[57] ABSTRACT

A focused ion beam apparatus which has a secondary electron energy filter apparatus. The secondary electron energy filter apparatus is basically composed of an extraction electrode for extracting secondary electrons generated from a sample by irradiating an ion beam thereon, and a grid electrode for discriminating the secondary electrons based on their energy levels. The focused ion beam apparatus is also equipped with a secondary electron detector for detecting secondary electrons which pass the grid electrode, thereby measuring the potential of the surface of the sample under treatment.

12 Claims, 4 Drawing Sheets

FOCUSED ION BEAM APPARATUS HAVING CHARGED PARTICLE ENERGY FILTER

BACKGROUND OF THE INVENTION

The present invention relates to an ion beam apparatus which changes wiring, or metallization, in an IC by ion beam etching or deposition of metal film thereon, and particularly to an ion beam apparatus which further functions as an IC tester for measuring a potential of a sample by irradiating an ion beam on the sample and analyzing energy of secondary electrons generated from the sample.

The density and size of wiring in an IC are further being miniaturized at a drastic rate. In order to promote and assist such drastic technology improvement, appropriate device verification technology and device malfunction analysis technology are indispensable. In the prior art technology, a pointed tungsten probe coupled to an oscilloscope is directly contacted to an IC device to measure internal signals thereof. This method is almost impossible to apply to the measurement of a VLSI because it is extremely difficult to position the very fine probe to an extremely fine target point. In order to overcome this difficulty, an electron beam (EB) tester was invented as a replacement of the conventional tester, whereby the measurement of signals at a miniaturized pattern has become possible.

However, even this method is not effective enough to apply to an IC device having wiring routes in multiple layers, nor can this method apply when there is a passivation film deposited over an IC device. Again, in order to solve these problems, a focused ion beam apparatus was invented. The apparatus can carry out various tasks, such as drilling a hole through a passivation film deposited over wiring, and cutting wiring by ion beam etching; and connecting wiring, and forming a probing pad through a passivation film by forming a metal film by the use of an ion beam CVD method. Since this apparatus can drill a hole through a passivation film provided over the IC wiring patterns, and form probing pads, an EB tester can measure internal signals of an IC device. (*Monthly Semiconductor World* 1987. September "Novel verification and analysis of VLSI using FIB").

FIG. 2 schematically shows a well known EB tester. Numeral 1 denotes an electron beam, numeral 2 an objective lens, numeral 3 a scanning electrode, numeral 4 a grid electrode, numeral 5 an extracting electrode, numeral 6 a sample such as an IC, numeral 7 secondary electrons, numeral 8 a secondary electron detector, numeral 9 an amplifier, numeral 10 a comparator, numeral 11 a power source for grid electrode 4, numeral 12 a monitor, and numeral 13 a power source for extracting electrodes.

In the EB tester having such structure as described above, secondary electrons 7 generated from the sample 6 by the irradiation of the electron beam 1 are decelerated in a deceleration magnetic field between the extraction electrode 5 and the grid electrode 4, and only the secondary electrons which pass the grid electrode are detected by the secondary electron detector 8. A detected signal is amplified by the amplifier 9, and inputted into the comparator 10 at which the detected signal is compared with a reference signal. The power source 11 is controlled to adjust the potential of the grid electrode 4 so that the detected signal becomes the same level as that of the reference signal. Then the potential so adjusted is displayed on the monitor 12 such as an oscilloscope, or a recorder.

FIG. 3 shows a focused ion beam apparatus of the prior art. Numeral 21 denotes an ion source, numeral 22 an ion beam, numeral 23 a beam monitor, numeral 24 is a condenser lens, numeral 25 a blanker, numeral 26 a shutter valve, numeral 27 a variable opening, numeral 28 an octapole stigmator, numeral 29 an objective lens, numeral 30 an X-Y deflector, numeral 31 a gas gun, numeral 32 a sample, numeral 33 a sample stage, numeral 34 a high voltage source, numeral 35 an ion optical system controller, numeral 36 a blanking amplifier, numeral 37 a scan controller, numeral 38 a gas gun controller, numeral 39 a secondary electron detector, numeral 40 an amplifier, numeral 41 a CRT, numeral 42 a stage driver, numeral 43 a stage controller, and numeral 44 a controlling computer system.

In this type of focused ion beam apparatus having the above-mentioned structure, a liquid metal ion source, such as gallium, etc., is used as the ion source 21, and an emission current is detected by the beam monitor 23 in order to stabilize the beam. The ion beam 22 is focused by the condenser lens 24 and the objective lens 29 and irradiated onto the sample 32. The variable opening 27 is used to change the beam current. By operating the sample stage 33 and the X-Y deflector 30, the focused ion beam can be scanned across only a required area of the sample. In order to determine the location at which treatment is required, secondary electrons generated from the sample by irradiating the ion beam thereon are detected by the secondary electron detector 39, and an image of the detected secondary electrons is displayed on the CRT 41. The image of the secondary electrons is inputted in the control computer system 44 which then registers several process conditions based on the image, thereby successively carrying out a series of processes.

This type of conventional focused ion beam apparatus, however, has a drawback. When a wiring pattern in an IC is changed or a probing pad is formed in an IC, the IC is then taken out of the vacuum chamber for function analysis by an external tester such as an EB tester. If the above process has to be repeated several times for, e.g., rearrangement of the wiring pattern, this process becomes time-consuming since it requires time for re-evacuation of the vacuum chamber, retreatment, reanalysis, etc.

SUMMARY OF THE INVENTION

An object of the invention, therefore, is to solve the above-mentioned problem. Another object of the invention is to provide a focused ion beam apparatus which has a secondary electron energy filter apparatus composed basically of an extraction electrode for extracting secondary electrons generated from a sample by irradiating an ion beam thereon, a grid electrode for discriminating the secondary electrons based on their energy levels, and a secondary electron detecting apparatus for detecting secondary electrons which pass the grid electrode, thereby measuring the potential of the surface of the sample under treatment.

DETAILED DESCRIPTION OF THE PREFERRED EMBODIMENTS

Figure 1:
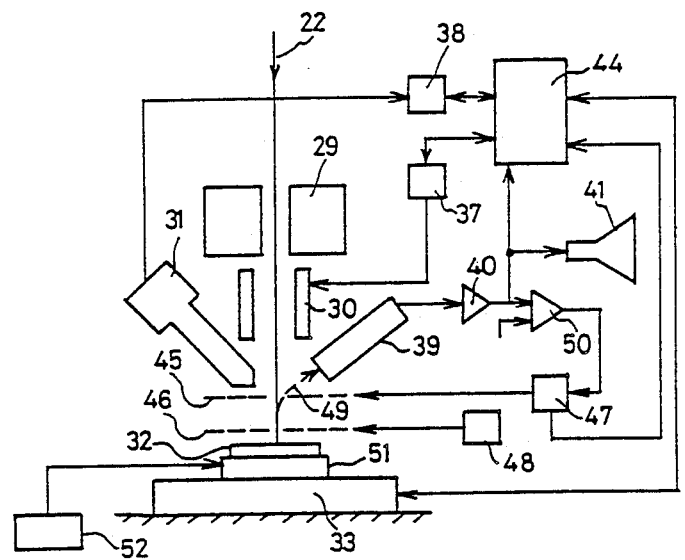
FIG. 1 schematically shows a focused ion beam apparatus of an embodiment of the present invention and a block diagram of its control system.
Figure 2:
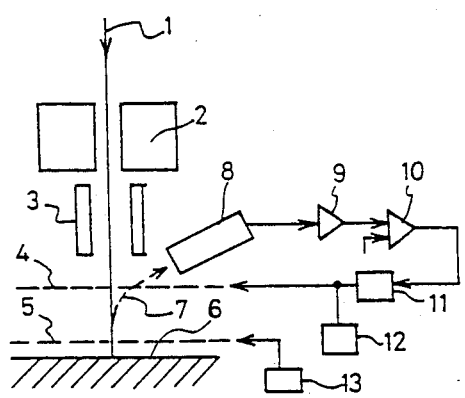
FIG. 2 schematically shows a conventional EB tester and a block diagram of its control system.
Figure 3:
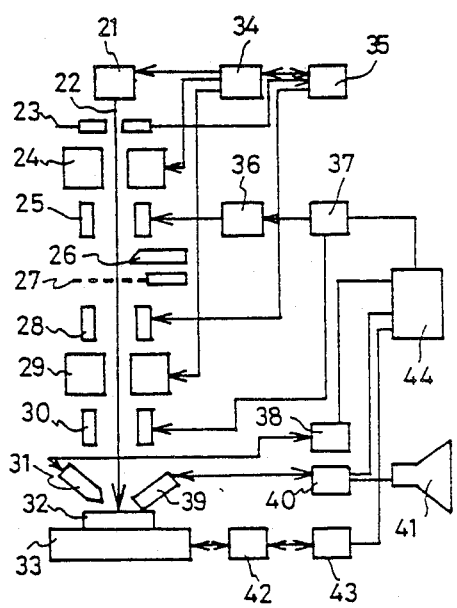
FIG. 3 schematically shows a conventional ion beam apparatus and a block diagram of its control system.

FIG. 1 schematically shows a focused ion beam apparatus equipped with a secondary electron energy filter apparatus according to the present invention. Numeral 45 shown in the figure denotes a grid electrode, numeral 46 an extraction electrode, numeral 47 a power source of the grid, numeral 48 an extraction electrode, numeral 49 secondary electrons generated by the irradiation of an ion beam, numeral 50 a comparator, numeral 51 an IC device holder having IC sockets or terminals, and numeral 52 a pattern generator. An ion beam is produced with an apparatus including a liquid metal ion source (not shown), an extraction electrode (not shown), and an aperture (not shown). Then, it is focused into an ion beam 22 on the order of submicron in diameter. This focused ion beam 22 is scanned across the surface of an IC sample 32 by an X-Y deflector 30. Secondary electrons 49 generated by beam 22 are detected by a detector 39, and observed on a CRT 41. It is therefore possible to locate an area in the IC where treatment is required. An area in the IC where a treatment is to be carried out by the ion beam 22 is then defined. Within the ion beam scanning area, the focused ion beam apparatus carries out tasks such as drilling through a passivation film and cutting wiring by the use of ion beam etching, and connecting wiring and forming probing pads by the use of a CVD method. Then, the ion beam scanning area is widened, or the ion beam current is reduced, in order to reduce the current density and consequently repress etching. The secondary electrons 49 generated by the ion beam are extracted by the extraction electrode 46 and directed toward the grid electrode 45. Only a part of the secondary electrons which have an energy level exceeding that of the deceleration magnetic field between the extraction electrode 46 and the grid electrode 45 pass the grid electrode 45 and are detected by the detector 39. It should be noted that the separation between the sample surface and the extraction electrode 46 is preferably 0.3 mm-1 mm. Then, a detected signal is amplified by an amplifier 40, and inputted into a comparator 50 at which the signal is compared with a reference signal. Then, the power source 47 is controlled to adjust the potential of the grid electrode 45 so that the detected signal level becomes the same as that of the reference signal. Thereafter, the reference signal level of the comparator 50 is changed to find a potential of the grid at which a constant intensity of the secondary electrons is obtained. This potential of the grid corresponds to the surface potential of the sample. Therefore, by monitoring the potential of the grid electrode 45, the potential of the sample can be measured. If the IC sample 32 is connected to the IC sockets of the holder 51, and a signal is inputted into the IC sample from an external pattern generator 52, functions of the IC sample after treatments can be analyzed.

The control computer system takes in an image of secondary electrons, registers several treatment conditions based on the image, carries out a series of successive treatments, repeats treatments, operates the sample stage 33, and monitors the potential of the grid electrode.

FIGS. 4 show a process of treatment and function analysis for an IC sample using a focused ion beam apparatus of the present invention.

Figure 4A:
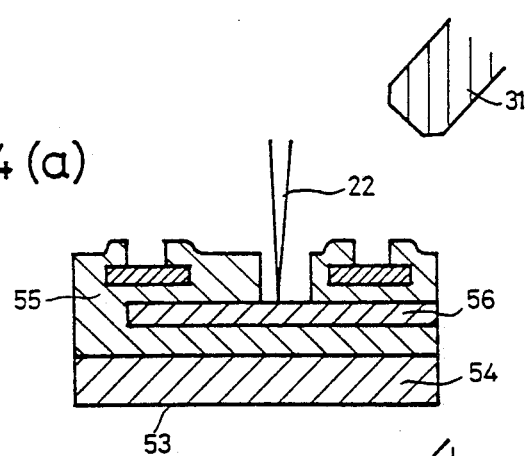
FIGS. 4(a) to 4(c) show a process of treatment and function analysis for an IC sample using a focused ion beam apparatus of an embodiment of the present invention.
Figure 4B:
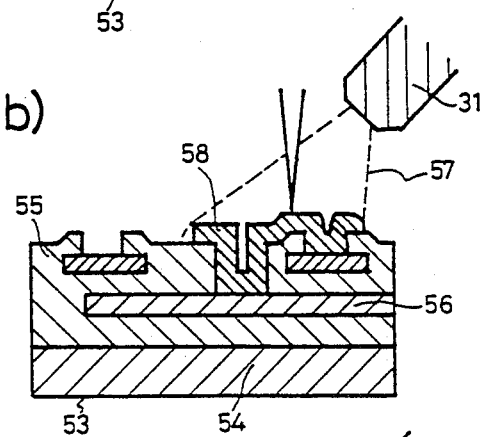
Figure 4C:
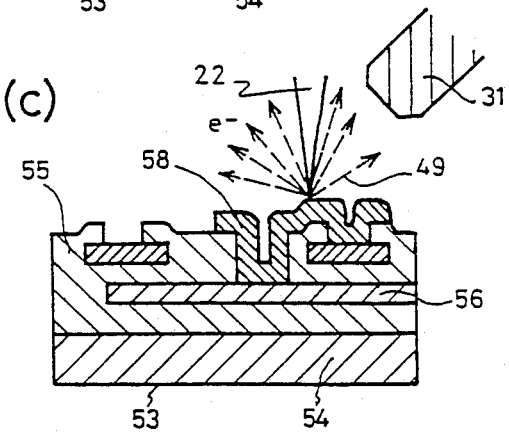

In FIGS. 4, numeral 53 denotes an IC sample having double layers of wiring patterns, and including a substrate 54, a passivation film 55 and an aluminum wiring 56, numeral 57 is a metal organic compound gas, and numeral 58 a metal film formed by an ion beam CVD method. First, a hole is drilled through passivation film 55 by etching using a focused ion beam 22 as shown in FIG. 4(a). Then, as shown in FIG. 4(b), molecules of a gas 57 provided by a gas gun 31 are deposited on the surface of the sample, and metal film 58 is selectively formed in an area irradiated by ion beam 22. After this treatment is completed, the current density of ion beam 22 is reduced in order to generate secondary electrons 49 from the sample, the energy of the secondary electrons 49 is discriminated, and the surface potential of the sample is measured as shown in FIG. 4(c).

In the above embodiment, the secondary electron energy filter is composed of two electrodes, extraction and grid electrodes. However, a secondary electron energy filter composed of three electrodes is also effective as disclosed hereunder.

According to the embodiment of the invention described above, the ion beam apparatus is equipped with a secondary electron energy filter which discriminates secondary electrons generated by the irradiation of an ion beam based on their energy levels. Therefore, the potential of the surface of a sample is measured during the treatment of the sample. Further, when a signal is inputted from an external pattern generator to an IC sample under treatment, which is possible according to the present invention, function analysis can be carried out. This means that one focused ion beam apparatus carries out tasks from treatments of an IC device to function analysis thereof, whereby the total time required for treatments is greatly reduced.

Figure 5:
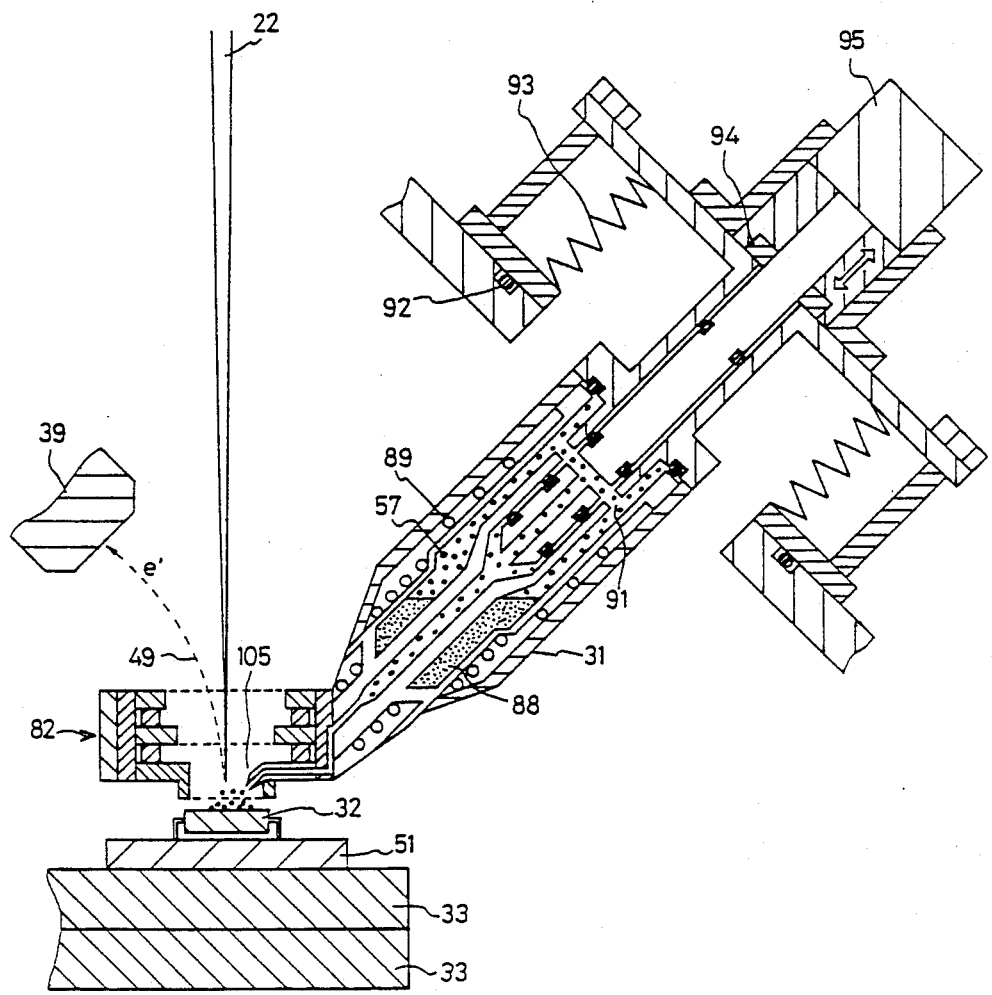
FIG. 5 is a schematic cross section of a gas directing apparatus equipped with a secondary electron energy filter of an embodiment of the present invention.
Figure 6:
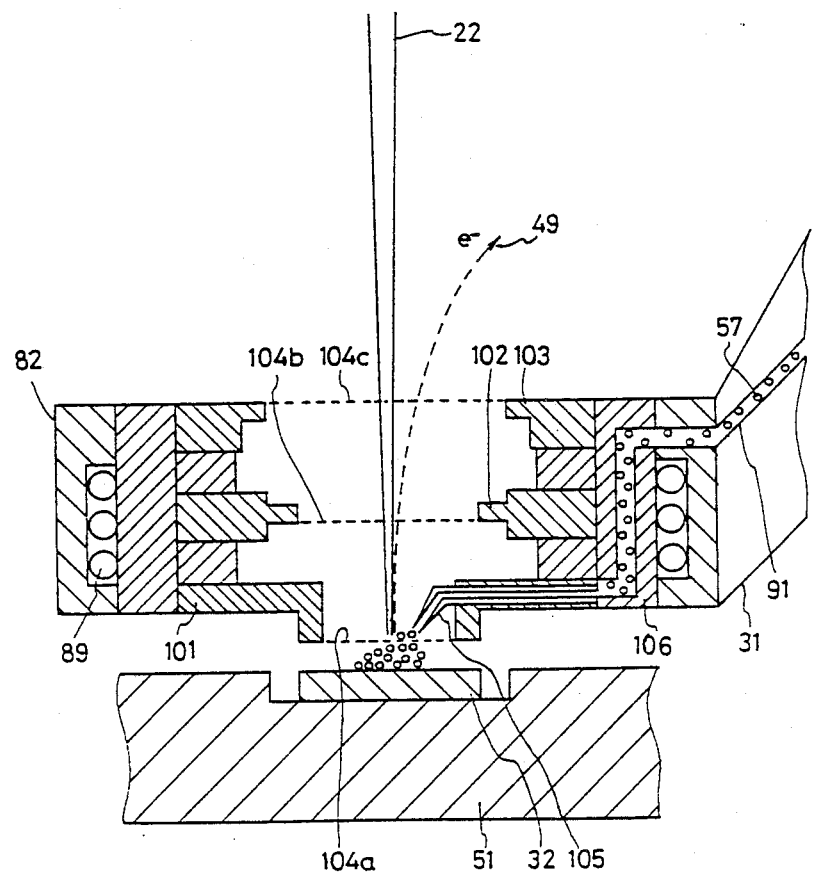
FIG. 6 is an enlarged view of the energy filter as shown in FIG. 5.

FIG. 5 is a schematic cross section of a gas directing apparatus equipped with a secondary electron energy filter of the present invention. An organic metal compound 88 is heated by a heater 89 and evaporated. The compound gas 57 passes through a gas conduit 91, and is introduced to a nozzle 105. Supply of the compound gas 57 is regulated or turned on and off by the operation of an air cylinder 95. The stroke of the air cylinder 95 can be adjusted by a stopper 94. The compound gas 57 is introduced through the tip of the nozzle to an area to be treated, and a metal film is selectively formed by a CVD method using the irradiation of the ion beam 22 in an area where the ion beam irradiates sample 32. Secondary electrons 49 generated during this treatment are discriminated by an energy filter 82, and detected by a secondary electron detector 39 for the measurement of the potential of the sample. Optimum positioning of the tip of the nozzle is carried out using a bellows 93. FIG. 6 is an enlarged view of the energy filter as shown in FIG. 5. Energy filter 82 is comprised of an extraction electrode 101, a grid electrode 102, and a focusing electrode 103. The openings formed by these electrodes are provided respectively with meshes 104a, 104b and 104c in the order from the smallest opening size. The compound gas 57 is supplied through the tip of the nozzle 105 into the area to be treated in the sample, and a metal film is formed using the ion beam 22. Secondary electrons 49 generated during this treatment by the irradiation of the ion beam are extracted by the extraction electrode 101, discriminated based on their energy levels. The focusing electrode 103 functions to improve the efficiency of detection of secondary electrons 49. The focusing electrode 103 stabilizes the ion beam 22 by reducing the influence of the grid electrode 102, and directs the secondary electrons which pass the grid electrode 102 toward a designated area, e.g., toward the secondary ion detector 39. The heater 89 is effective to prevent solidification of the compound gas 57, which would result in deterioration of the dielectric property of a glass insulator 106, or clogging of the gas conduit 91.

The focused ion beam apparatus according to the above embodiment has an energy filter for discriminating secondary electrons generated by the irradiation of an ion beam depending on their energy levels, and a nozzle of a gas directing apparatus, both of which are combined in one piece. Due to this structure, the nozzle is therefore located between the detector and the sample at an optimum position. Therefore, it is possible to carry out function analysis of an IC when treatments such as etching, deposition of a metal film, etc., are carried out, whereby completion of a treatment is easily confirmed, and time for such treatment is greatly reduced.

What is claimed is:

1. Ion beam apparatus for treating a specimen comprising:
    sample stage means for mounting a specimen thereon and moving the sample in X, Y and Z directions;
    ion beam irradiation means for irradiating a surface of the specimen with a focused ion beam;
    detecting means for detecting secondary electrons emitted by the irradiated specimen;
    energy filtering means having an extraction electrode for extracting the secondary electrons from the specimen surface, a grid electrode and a grid electrode power source for controlling the voltage of the grid electrode to selectively pass extracted electrons, the energy filtering means being disposed between the specimen and said detecting means for discriminating the secondary electrons emitted by the irradiated specimen according to their energy levels; and
    input means for inputting a signal to the specimen.

2. Ion beam apparatus defined in claim 1, further comprising gas directing means for directing a compound vapor containing depositable conductive material onto a designated treatment area of the specimen.

3. Ion beam apparatus defined in claim 1, further comprising a third electrode for reducing the influence of said grid electrode and directing charged particles which pass said grid electrode toward a designated area.

4. Ion beam apparatus defined in claim 1, wherein said extraction electrode is located over the specimen with a separation of 0.3 mm to 1 mm from the surface of the specimen.

5. Ion beam apparatus defined in claim 1, wherein said energy filtering means has a gas directing means for directing a compound vapor containing depositable conductive material onto a designated treatment area of the specimen.

6. Ion beam apparatus defined in claim 1, wherein said ion beam irradiation means has an ion source of a liquid metal ion.

7. An ion beam apparatus for treating a specimen, the apparatus comprising:
    a signal input adapted to be connected with the specimen for applying an electrical signal to the specimen;
    an ion beam source for irradiating the specimen with an ion beam, whereby secondary electrons are emitted by the specimen;
    a secondary electron detector; and
    an energy filter having an extraction electrode for extracting the secondary electrons from the specimen, a grid electrode, and a grid electrode power source for controlling the voltage of the grid electrode to selectively pass extracted electrons, the energy filter being disposed between the location of the specimen and the secondary electron detector.

8. Ion beam apparatus defined in claim 7, further comprising gas directing means for directing a compound vapor containing depositable conductive material onto a designated treatment area of the specimen.

9. Ion beam apparatus defined in claim 7, further comprising a third electrode for reducing the influence of said grid electrode and directing charged particles which pass said grid electrode toward a designated area.

10. Ion beam apparatus defined in claim 7, wherein said extraction electrode is located over the location of the specimen with a separation of 0.3 mm to 1 mm from the surface of the specimen.

11. Ion beam apparatus defined in claim 7, wherein said energy filter has a gas directing means for directing a compound vapor containing depositable conductive material onto a designated treatment area of the specimen.

12. Ion beam apparatus defined in claim 7, wherein said ion beam source has an ion source of a liquid metal ion.

* * * * *